(12) United States Patent
Cai

(10) Patent No.: US 10,504,972 B2
(45) Date of Patent: Dec. 10, 2019

(54) ORGANIC LIGHT EMITTING DISPLAY PANEL AND METHOD FOR MANUFACTURING THE SAME

(71) Applicants: SHANGHAI TIANMA MICRO-ELECTRONICS CO., LTD., Shanghai (CN); TIANMA MICRO-ELECTRONICS CO., LTD., Shenzhen (CN)

(72) Inventor: Yu Cai, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 15/497,215

(22) Filed: Apr. 26, 2017

(65) Prior Publication Data
US 2017/0229522 A1    Aug. 10, 2017

(30) Foreign Application Priority Data
Oct. 24, 2016    (CN) .......................... 2016 1 0925777

(51) Int. Cl.
*H01L 27/32*    (2006.01)
*G06F 3/041*    (2006.01)
(Continued)

(52) U.S. Cl.
CPC .......... *H01L 27/323* (2013.01); *G06F 3/0412* (2013.01); *G06F 2203/04104* (2013.01);
(Continued)

(58) Field of Classification Search
None
See application file for complete search history.

(56) References Cited

U.S. PATENT DOCUMENTS

2002/0151161 A1    10/2002    Furusawa
2006/0134918 A1*   6/2006    Fujii ....................... H01L 23/48
                                                      438/694
(Continued)

FOREIGN PATENT DOCUMENTS

| CN | 101630639 A | | 1/2010 |
| EP | 2902115 A1 | | 8/2015 |
| JP | 2005-339808 A | * | 8/2005 |

OTHER PUBLICATIONS

Machine language translation of JP 2005-339808 A.*

*Primary Examiner* — Erik Kielin
(74) *Attorney, Agent, or Firm* — Kilpatrick Townsend & Stockton, LLP

(57) ABSTRACT

An organic light emitting display panel and a method for manufacturing the same are provided. The organic light emitting display panel includes: an organic light emitting element array substrate; a thin film encapsulation layer covering the organic light emitting element array substrate and including at least one inorganic layer and at least one organic layer; a wettability adjustment layer disposed on an organic layer or inorganic layer of the thin film encapsulation layer and including a plurality of wettability adjustment pattern zones and a plurality of hollow zones, and touch electrodes made of metal. The touch electrodes are in a meshed shape and disposed in the hollow zones. A wetting angle between material of the touch electrodes and the wettability adjustment pattern zones is greater than a wetting angle between the material of the touch electrodes and the organic layer or the inorganic layer.

13 Claims, 11 Drawing Sheets

(51) Int. Cl.
*G09G 3/3208* (2016.01)
*H01L 27/28* (2006.01)
*H01L 51/56* (2006.01)

(52) U.S. Cl.
CPC .......... *G09G 3/3208* (2013.01); *H01L 27/286* (2013.01); *H01L 51/56* (2013.01); *H05K 2203/013* (2013.01)

(56) References Cited

U.S. PATENT DOCUMENTS

| | | | |
|---|---|---|---|
| 2009/0224237 A1 | 9/2009 | Isa et al. | |
| 2014/0374704 A1* | 12/2014 | Jang | H01L 51/0097 257/40 |
| 2015/0008019 A1* | 1/2015 | Miura | H05K 3/1208 174/255 |
| 2015/0084907 A1* | 3/2015 | Burberry | G06F 3/046 345/174 |
| 2015/0242025 A1* | 8/2015 | Cok | G06F 3/046 29/622 |
| 2016/0062520 A1* | 3/2016 | Choi | H01L 27/3248 345/174 |
| 2017/0338442 A1* | 11/2017 | Ishida | G09F 9/30 |
| 2018/0024689 A1* | 1/2018 | Yoshiki | G06F 3/0416 |
| 2018/0301516 A1* | 10/2018 | Huang | G06F 3/0412 |

\* cited by examiner

ORGANIC LIGHT EMITTING DISPLAY PANEL AND METHOD FOR MANUFACTURING THE SAME

CROSS-REFERENCE TO RELATED APPLICATIONS

This application claims priority to Chinese patent application No. 201610925777.8, filed on Oct. 24, 2016, and entitled "Organic Light Emitting Display Panel and Method for Manufacturing the same", the disclosure of which is incorporated herein by reference in its entirety.

TECHNICAL FIELD

Embodiments of the present disclosure relate to the field of display technologies, in particular to an organic light emitting display panel and a method for manufacturing the same.

BACKGROUND

At present, for a flexible display panel employing an organic light emitting diode, a touch film assembly is generally required to be attached on the display panel for realizing a touch sensing function. As a result, the thinning of the flexible display panel cannot be achieved. For making a touch flexible display panel thinner and lighter, the conventional film assembly attachment technology is replaced by an integration technology. The present integration technology mainly includes the following two types.

In a first type, a touch electrode is integrated in one of a protective film, a polarizer and a glass cover plate. In this way, although the flexible display product is thinned in a certain extent, manufacturing requirements for the protective film, the polarizer and the glass cover plate are relative high.

In a second type, the touch electrode is integrated on a surface of a thin film encapsulation layer, and the touch electrode is required to be subjected to a photoetching and a wet etching. However, the yellow light effect and the like in the photoetching will damage a light emitting layer of the organic light emitting display panel. In addition, an acidic solution or alkaline solution used in the wet etching will easily damage each film in the thin film encapsulation layer.

SUMMARY

The present disclosure provides an organic light emitting display panel and a method for manufacturing the same, so as to effectively prevent the manufacturing process of the touch electrode from damaging each film of the thin film encapsulation layer and the light emitting element film in the organic light emitting display panel, and improve operation reliability of the organic light emitting display panel.

According to a first aspect, an embodiment of the present disclosure provides an organic light emitting display panel including:

an organic light-emitting element array substrate;

a thin film encapsulation layer covering the organic light-emitting element array substrate, wherein the thin film encapsulation layer comprises at least one inorganic layer and at least one organic layer;

a wettability adjustment layer disposed on one of the at least one organic layer and at least one inorganic layer of the thin film encapsulation layer, wherein the wettability adjustment layer comprises a plurality of wettability adjustment pattern zones and hollow zones among the plurality of wettability adjustment pattern zones; and touch electrodes, wherein the touch electrodes are made of metal and in a meshed structure, and are disposed in the hollow zones, wherein a wetting angle between material of the touch electrodes and the wettability adjustment pattern zones is $\alpha$, a wetting angle between the material of the touch electrodes and an inorganic layer or an organic layer is $\beta$, the inorganic layer or the organic layer is located at a first side of the wettability adjustment layer, the first side of the wettability adjustment layer faced the organic light emitting element array substrate, where $\alpha$ is greater than $\beta$.

According to a second aspect, an embodiment of the present disclosure further provides a method for manufacturing an organic light emitting display panel, including:

forming an organic light emitting element array substrate;

forming a thin film encapsulation layer covering the organic light emitting element array substrate, wherein the thin film encapsulation layer comprises at least one inorganic layer and at least one organic layer;

after forming the inorganic layer or organic layer of the thin film encapsulation layer, the method further comprising:

forming a wettability adjustment layer comprising a plurality of wettability adjustment pattern zones and hollow zones among the plurality of wettability adjustment pattern zones on the inorganic layer or organic layer of the thin film encapsulation layer;

forming touch electrodes in the hollow zones, wherein the touch electrodes are made of metal and in a meshed structure, a wetting angle between material of the touch electrodes and the wettability adjustment pattern zones is $\alpha$, and a wetting angle between the material of the touch electrodes and an inorganic layer or an organic layer is $\beta$, the inorganic layer or the organic layer is located at a first side of the wettability adjustment layer, the first side of the wettability adjustment layer faced the organic light emitting element array substrate, where $\alpha$ is greater than $\beta$.

DETAILED DESCRIPTION

Figure 1A:
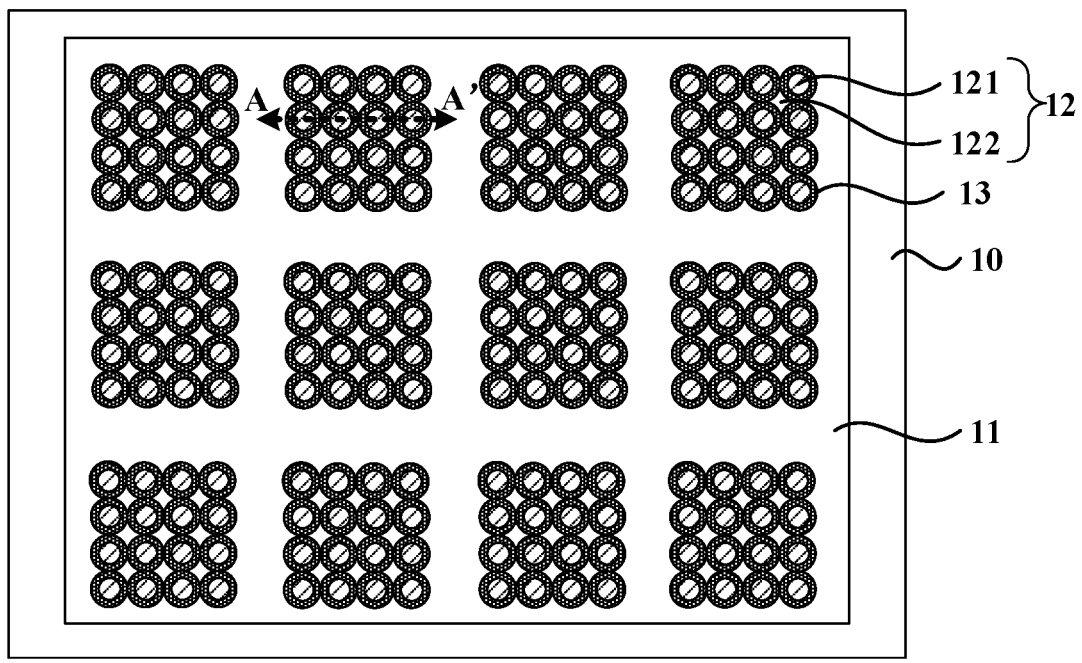
FIG. 1A is a schematic top view showing a structure of an organic light emitting display panel according to an embodiment of the present disclosure.

The disclosure will be further described in detail below in conjunction with the accompanying drawings and embodiments. It should be noted that the specific embodiments disclosed herein are intended for explaining, rather than limiting, the disclosure. It should also be noted that the accompanying drawings show only some parts relating to the disclosure, but not in an exhaustive way, for the ease of description.

An embodiment of the present disclosure provides an organic light emitting display panel. The organic light emitting display panel includes: an organic light emitting element array substrate; a thin film encapsulation layer which covers the organic light emitting element array substrate and includes at least one inorganic layer and at least one organic layer; a wettability adjustment layer disposed on an inorganic layer or an organic layer of the thin film encapsulation layer, the wettability adjustment layer includes a plurality of wettability adjustment pattern zones and hollow zones among the plurality of wettability adjustment pattern zones; and touch electrodes, which are made of metal and in a meshed shape, and are disposed in the hollow zones.

Since the light emitting element layer of the organic light emitting display panel is very sensitive to external environment factors such as moisture and oxygen, the performance of the organic light emitting display panel deteriorates drastically or is broken down completely if the light emitting element layer of the organic light emitting display panel is exposed in an environment of moisture or oxygen. For improving the using life and stability of the organic light emitting display panel, it is necessary to seal the light emitting element layer by means of the thin film encapsulation layer. The thin film encapsulation layer may be a single-layer structure or a multi-layer structure. The material used in the thin film encapsulation layer may be organic material or inorganic material. Alternatively, the thin film encapsulation layer is stacked layers of the organic layer and the inorganic layer According to the present disclosure, the touch electrodes are provided in the thin film encapsulation layer, so that the touch electrodes may be prevented from being corroded by the external moisture, oxygen and the like on one hand, and the thickness of the organic light emitting display panel would not be increased on the other hand, consisting with the development trend of being thinner. In addition, since the touch electrodes are made of metal and in a meshed structure, the touch electrodes have a good malleability, thereby further increasing the (anti-folding ability) folding resistance of the touch electrodes.

According to the present disclosure, a wetting angle between material of the touch electrodes and the wettability adjustment pattern zones is $\alpha$, a wetting angle between the material of the touch electrodes and an inorganic layer or an organic layer is $\beta$, the inorganic layer or the organic layer is located at a first side of the wettability adjustment layer, the first side of the wettability adjustment layer faced the organic light emitting element array substrate, where $\alpha$ is greater than $\beta$.

It should be noted that the wetting angle between the material of the touch electrodes and the wettability adjustment pattern zones refers to a wetting angle between the wettability adjustment pattern zones and the touch electrode fluid drop (liquid including the material of touch electrodes and solvent) when forming the touch electrodes. The touch electrode fluid drop spreads along the edge of the wetting adjustment zones by means of own surface tension of the touch electrode fluid drop and forms in the hollow zones among the plurality of wettability adjustment pattern zones, because the wetting angle $\alpha$ between the material of the touch electrodes and the wettability adjustment pattern zones is greater than the wetting angle $\beta$ between the material of the touch electrodes and the inorganic layer or organic layer, the inorganic layer or the organic layer is located at a first side of the wettability adjustment layer, the first side of the wettability adjustment layer faced the organic light emitting element array substrate. Optionally, the wettability adjustment layer may be directly disposed on the surface of the inorganic layer or the organic layer. According to the present disclosure, the touch electrodes are disposed in the hollow zones among the plurality of wettability adjustment pattern zones by means of utilizing the wettability adjustment layers, therefore the damages from the manufacturing process of photoetching and etching the touch electrodes in the existing technology to each film layer material of the thin film encapsulation layer and the light emitting element film layer material of the organic light emitting display panel are avoided, and the operation reliability of the organic light emitting display panel is protected.

The shape of the wettability adjustment pattern zones is not limited by the present disclosure, and may be a regular shape or an irregular shape. Optionally, the vertical projection of the plurality of wettability adjustment pattern zones on the organic light emitting element array substrate may be presented as a matrix, an element of which is selected from one of a circle array, a polygon array or an ellipse array, such arrangements can simplify the complexity of the process.

Optionally, a length of the longest axis of the wettability adjustment pattern zones is in a range of 20~300 µm. The longest axis herein refers to the diameter with respect to the wettability adjustment pattern zones arranged in the circle array, refers to the major axis with respect to the wettability adjustment pattern zones arranged in the ellipse array, and refers to a length of the longest line connecting any two vertexes with respect to the wettability adjustment pattern zones arranged in the polygon array. The size of the wettability adjustment pattern zones may be set according to the size of a light emitting element of the organic light emitting display panel. For example, the wettability adjustment pattern zone corresponds to one or more light emitting elements.

Optionally, the width of each of the hollow zones among adjacent wettability adjustment pattern zones is less than 10 µm (micrometer). For example, the width of the hollow zones is determined according to the spacing between the adjacent light emitting elements. The adjacent light emitting elements of the organic light emitting display panel are separated by a pixel define layer. The width of the hollow zones among adjacent wettability adjustment pattern zones is less than or equal to the width of the pixel define layer between adjacent light emitting elements. That is, the vertical projection of the hollow zones among adjacent wettability adjustment pattern zones on the organic light emitting element array substrate is within the vertical projection of the pixel define layer between adjacent light emitting elements on the organic light emitting element array substrate. Such arrangement can avoid that the touch electrodes in the hollow zones shield the light emitting element, and affects an aperture ratio and a light emitting efficiency of the organic light emitting display panel.

Optionally, a thickness of each of the wettability adjustment pattern zones is in a range of 0.1~10 µm. The thickness of the wettability adjustment pattern zones may be set according to requirements of actual products based on the concept and inspiration of the present disclosure. The thickness value range of 0.1~10 µm can ensure that the wettability adjustment pattern zones are of sufficient wettability adjustment capacity to the touch electrode fluid drop without influencing the thickness and light of the organic light emitting display panel.

Optionally, the wettability adjustment layer may be formed by means of an ink-jet printing process, a silkscreen printing process or vapor deposition process. The touch electrodes may be formed by means of the ink-jet printing process or a coating process. The material used in forming the touch electrodes may be silver paste.

Optionally, the thin film encapsulation layer, the wettability adjustment layer and the touch electrodes may be formed by a same sort of process. For example, the thin film encapsulation layer, the wettability adjustment layer and the touch electrodes may be formed by means of ink-jet printing. The advantages of such arrangement are that after the organic light emitting element array substrate is formed, the subsequent manufacturing of the thin film encapsulation layer, the wettability adjustment layer and the touch electrodes can be performed by means of one sort of process, thereby avoiding changing manufacturing chamber and the transport pollution of the specimen and simplifying the manufacturing process of the organic light emitting display panel.

Optionally, the material of the wettability adjustment pattern zones is organic material, exemplarily, may be one or more of polytetrafluoroethylene, perfluoroalkoxyalkane, perfluoroethylene propylene copolymer, ethylene-tetrafluoroethylene copolymer, polyvinylidene fluoride, polychlorotrifluoroethylene, ethylene-trifluoroethylene copolymer, polytetrachloride ethylene-perfluoro-dioxolane copolymer and polyvinyl fluoride. In addition, the material of the wettability adjustment pattern zones may be inorganic material.

Optionally, the range of the wetting angle between the wettability adjustment pattern zones and material of the touch electrodes is in a range of 60 to 180 degrees (60°-180°). The above range of the wetting angle can avoid that the touch electrode fluid drop fails to spread to the hollow zones due to too small wetting angle.

Optionally, the wettability adjustment layer is disposed on the organic layer or inorganic layer, the wetting angle between which and the material of touch electrodes is the minimum, of the thin film encapsulation layer. The touch electrode fluid drop can spread from the edge of the wettability adjustment pattern zones more easily and formed in the hollow zones among the wettability adjustment pattern zones by means of disposing the wettability adjustment layer on the organic layer or inorganic layer, the wetting angle between which and material of the touch electrodes is the minimum, of the thin film encapsulation layer. Optionally, the wetting angle for the organic layer or inorganic layer, the wetting angle between which and the material of the touch electrodes is minimum, of the thin film encapsulation layer, is in a range of 1°~10°.

The technical solution in the embodiments of the present disclosure will be described clearly and completely below in conjunction with the accompanying drawings of the embodiments of the present disclosure. All other embodiments obtained by those skilled in the art based on the embodiments of the present disclosure without paying creative labor fall into the protection scope of the present disclosure.

Figure 1B:
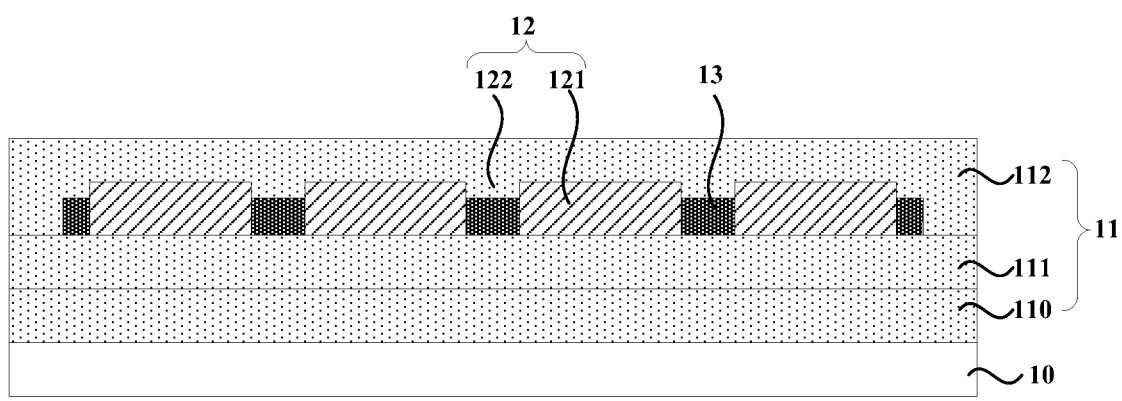
FIG. 1B is a schematic view showing a sectional structure along AA' in FIG. 1A.

FIG. 1A is a schematic top view showing the structure of an organic light emitting display panel according to an embodiment of the present disclosure. FIG. 1B is a schematic view showing a sectional structure along AA' in FIG. 1A. Referring to FIG. 1A and FIG. 1B, the organic light emitting display panel includes: an organic light emitting element array substrate 10, a thin film encapsulation layer 11, a wettability adjustment layer 12 and touch electrodes 13. For example, the thin film encapsulation layer 11 may include at least one organic layer and at least one inorganic layer stacked arranged. As shown in FIG. 1B, the thin film encapsulation layer 11 is exemplarily provided with a first inorganic layer 110, a first organic layer 111 and a second inorganic layer 112. The wettability adjustment layer 12 includes wettability adjustment pattern zones 121 and hollow zones 122. As shown in FIG. 1A, the wettability adjustment pattern zones 121 are exemplarily configured to be a circle array whose vertical projection on the organic light emitting element array substrate 10 is in a matrix arrangement. The first organic layer 111 is disposed between the first inorganic layer 110 and the second inorganic layer 112. The wettability adjustment layer 12 is disposed between the first organic layer 111 and the second inorganic layer 112. The first organic layer 111 is disposed on a side away from the organic light emitting element array substrate 10 of the first inorganic layer 110. The wetting angle between the first organic layer 111 and the material of the touch electrodes 13 is the minimum.

The touch electrodes 13 is a metal meshed structure and within the hollow zones 122. The wetting angle between the material of the touch electrodes 13 and the wettability adjustment pattern zones 121 is α, the wetting angle between the material of the touch electrodes 13 and the first organic layer 111 is β, where α is greater than β. Touch electrode fluid drops will spread along edge of the wettability adjustment pattern zones 121 by means of own surface tension of the touch electrode fluid drops, so that form in the hollow zones 122 among a plurality of wettability adjustment pattern zones 121, and a meshed structure is formed on the first organic layer 111 of the thin film encapsulation layer 11.

When the wetting angle between the material of the touch electrodes 13 and the first organic layer 111 is the minimum compared with the first inorganic layer 110 and the second inorganic layer 112, the wettability adjustment layer 12 is selected to be formed between the first organic layer 111 and the second inorganic layer 112, so as to ensure that the touch electrodes 13 are exactly formed within the hollow zones of the wettability adjustment layer 12.

Figure 2A:
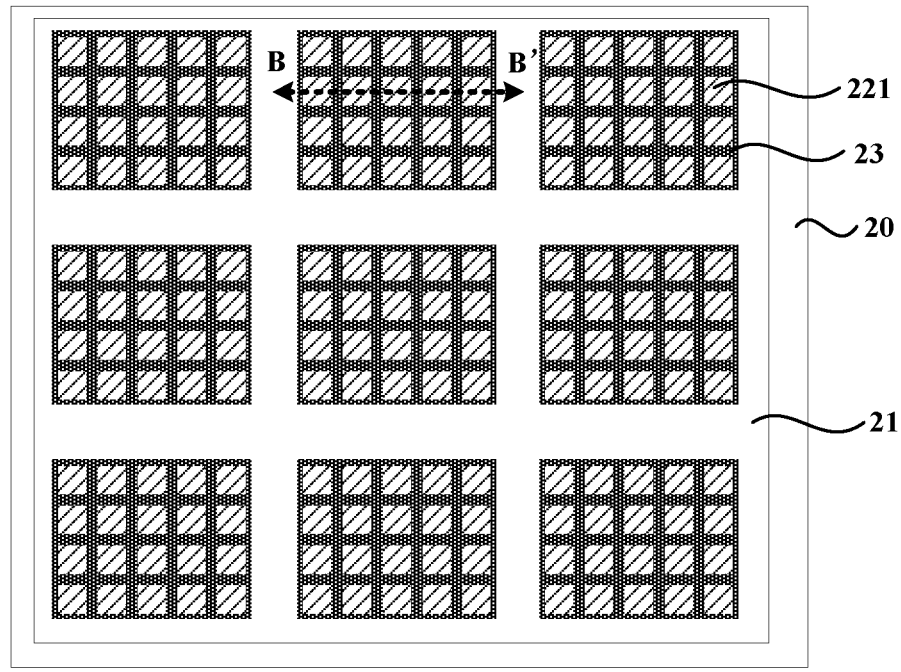
FIG. 2A is a schematic top view showing a structure of another organic light emitting display panel according to an embodiment of the present disclosure.
Figure 2B:
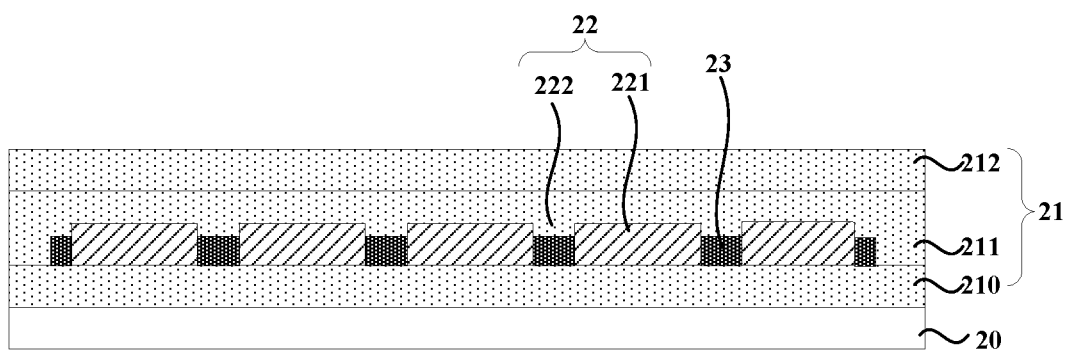
FIG. 2B is a schematic view showing a sectional structure along BB' in FIG. 2A.

Exemplarily, FIG. 2A is a schematic top view showing the structure of another organic light emitting display panel according to an embodiment of the present disclosure. FIG. 2B is a schematic view showing the sectional structure along BB' in FIG. 2A. Referring to FIG. 2A and FIG. 2B, the organic light emitting display panel includes an organic light emitting element array substrate 20, a thin film encapsulation layer 21, a wettability adjustment layer 22 and touch electrodes 23. The thin film encapsulation layer 21 includes a first inorganic layer 210, a first organic layer 211 and a second inorganic layer 212. The wettability adjustment layer 22 includes wettability adjustment pattern zones 221 and hollow zones 222. As shown in FIG. 2A, the wettability adjustment pattern zones 221 are exemplarily configured to be a rectangle array whose vertical projection on the organic light emitting element array substrate 20 is in a matrix arrangement. The first organic layer 211 is disposed between the first inorganic layer 210 and the second inorganic layer 212. Being different from FIG. 1A and FIG. 1B, the wettability adjustment layer 22 is disposed between the first inorganic layer 210 and the first organic layer 211; the first organic layer 211 is disposed on a side away from the organic light emitting element array substrate 20 of the first inorganic layer 210; and the wetting angel between the first inorganic layer 210 and the material of the touch electrodes 23 is the minimum.

Specifically, when the wetting angle between the material of the touch electrodes 23 and the first inorganic layer 210 is the minimum compared with the first organic layer 211 and the second inorganic layer 212, the wettability adjustment layer 22 is selected to be formed between the first organic layer 211 and the first inorganic layer 210, so as to ensure that the touch electrodes 23 are exactly formed within the hollow zones of the wettability adjustment layer 22.

Figure 3A:
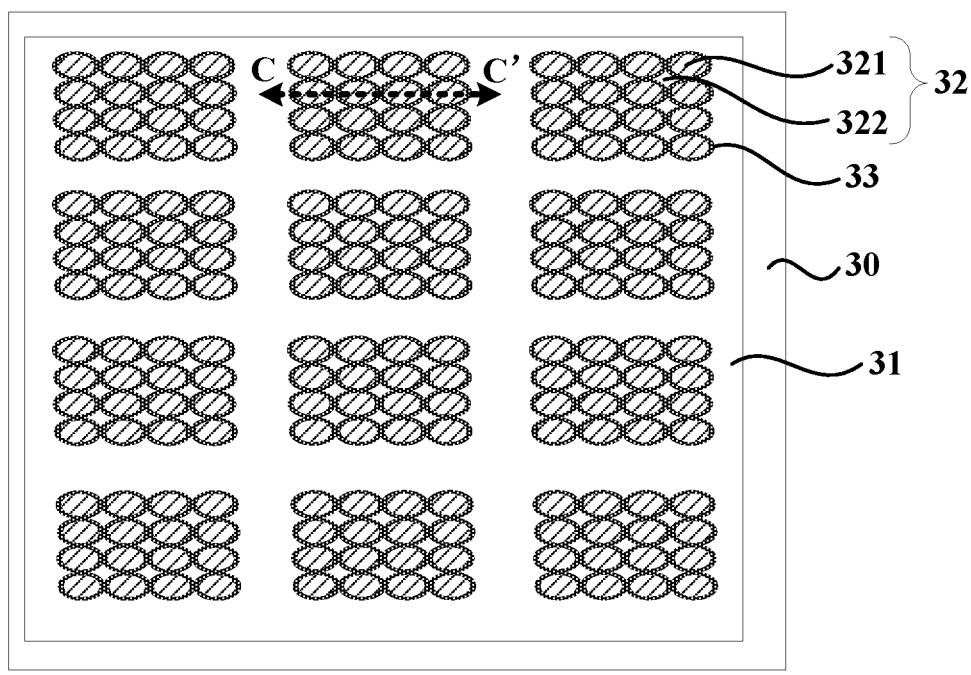
FIG. 3A is a schematic top view showing a structure of another organic light emitting display panel according to an embodiment of the present disclosure.
Figure 3B:
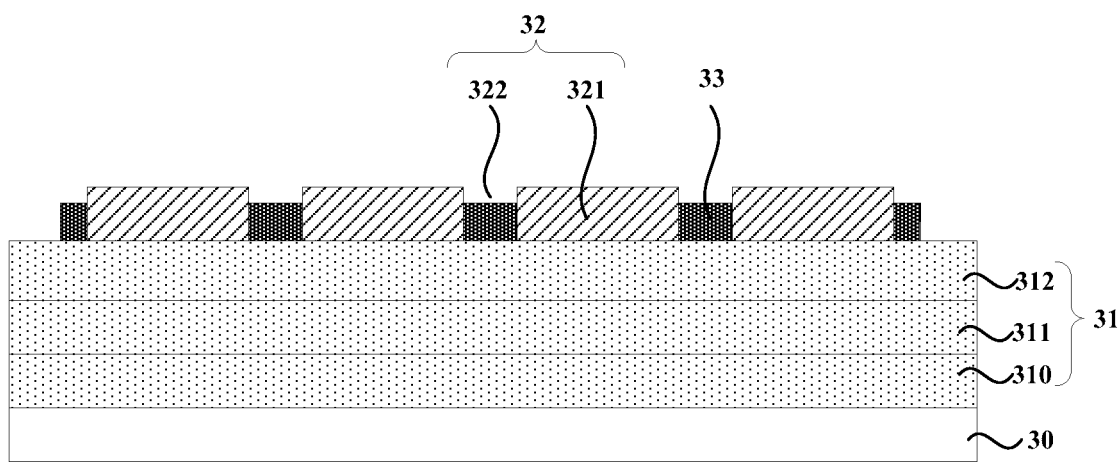
FIG. 3B is a schematic view showing a sectional structure along CC' in FIG. 3A.

FIG. 3A is a schematic top view showing the structure of another organic light emitting display panel according to an embodiment of the present disclosure. FIG. 3B is a schematic view showing the sectional structure along CC' in FIG. 3A. Referring to FIG. 3A and FIG. 3B, the organic light emitting display panel includes an organic light emitting element array substrate 30, a thin film encapsulation layer 31, a wettability adjustment layer 32 and touch electrodes 33. The thin film encapsulation layer 31 includes a first inorganic layer 310, a first organic layer 311 and a second inorganic layer 312. The first organic layer 311 is disposed between the first inorganic layer 310 and the second inorganic layer 312. Being different from FIG. 1A and FIG. 1B, the wettability adjustment layer 32 is provided on a side away from the first organic layer 311 of the second inorganic layer 312. The first organic layer 311 is provided on a side away from the organic light emitting element array substrate 30 of the first inorganic layer 310. The wetting angle between the second inorganic layer 312 and the material of the touch electrodes 33 is the minimum. As shown in FIG. 3A, the wettability adjustment pattern zones 321 is exemplarily configured to be an ellipse array whose vertical projection on the organic light emitting element array substrate 30 is in a matrix arrangement.

Specifically, when the wetting angle between the material of the touch electrodes 33 and the second inorganic layer 312 is the minimum compared with the first organic layer 311 and the first inorganic layer 310, the wettability adjustment layer 32 is selected to be formed at the side away from the first organic layer 311 of the second inorganic layer 312, so as to ensure that the touch electrodes 33 are exactly formed within the hollow zones of the wettability adjustment layer 32.

It should be noted that, the organic light emitting display panels shown in FIGS. 1A to 3B may be a self-capacitance touch. That is, the touch electrodes include a plurality of touch electrode blocks. A capacitor is formed between each touch electrode block and the ground. A touch position is determined by means of detecting the capacitance fed back from the touch electrode blocks. In addition, the positions of the organic layers and the inorganic layers in the stacked structure and the number of layers of the organic layers and the inorganic layers are not limited by embodiments of the present disclosure, and whether the organic layer or the inorganic layer contacts the organic light emitting element array substrate is not limited by embodiments of the present disclosure. Only the stacked first inorganic layer, first organic layer and second inorganic layer are exemplarily illustrated in the organic light emitting display panel shown in the above FIGS. 1A to 3B. In other embodiments, the number of the inorganic layers and the organic layers may be set according to requirements of actual products. For example, at least one organic layer and/or at least one inorganic layer is disposed between the first inorganic layer and the organic light emitting element array substrate, or at least one organic layer and/or at least one inorganic layer is disposed at the side, away from the organic light emitting element array substrate, of the second inorganic layer.

Figure 4A:
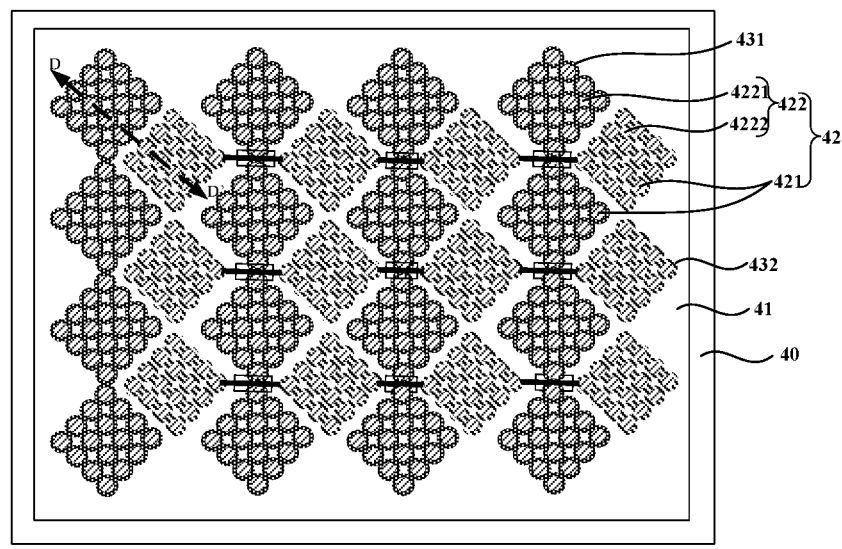
FIG. 4A is a schematic top view showing a structure of another organic light emitting display panel according to an embodiment of the present disclosure.
Figure 4B:
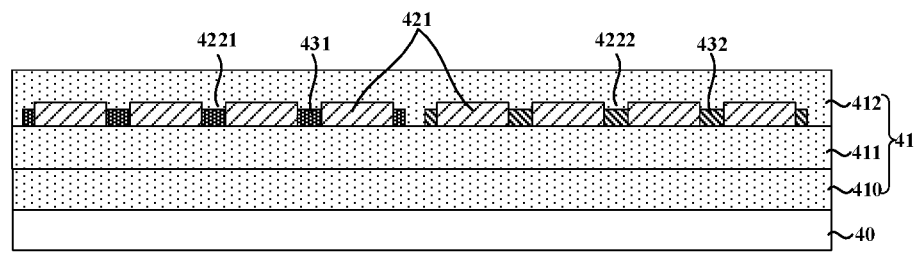
FIG. 4B is a schematic view showing a sectional structure along DD' in FIG. 4A.

In other embodiments, the organic light emitting display panel of the embodiments of the present disclosure may be also applicable to mutual capacitance touch. FIG. 4A is a schematic top view showing the structure of another organic light emitting display panel according to an embodiment of the present disclosure. FIG. 4B is a schematic view showing the sectional structure along DD' in FIG. 4A. Referring to FIGS. 4A and 4B, the organic light emitting display panel includes an organic light emitting element array substrate 40, a thin film encapsulation layer 41, a wettability adjustment layer 42 and touch electrodes. The thin film encapsulation layer 41 includes a first inorganic layer 410, a first organic layer 411 and a second inorganic layer 412. The first organic layer 411 is disposed between the first inorganic layer 410 and the second inorganic layer 412. Being different with the above embodiments, the touch electrodes include a plurality of touch driving electrodes 431 and a plurality of touch sensing electrodes 432. The touch driving electrodes 431 are disposed in a same layer as the touch sensing electrodes 432 and insulated from the touch sensing electrodes 432. That is, the touch driving electrodes 431 and the touch sensing electrodes 432 are provided in a same layer. Exemplarily, in FIG. 4A, since the touch driving electrodes 431 and the touch sensing electrodes 432 are provided in a same layer, each row of touch sensing electrodes 432 is separated by the touch driving electrodes 431, and the touch sensing electrodes 432 at both sides of a separation position in the row are electrically connected to each other by means of a bridge structure. An insulation layer is disposed at a region where the bridge structure and the touch driving electrodes 431 are overlapped so as to keep the touch driving electrodes 431 and the touch sensing electrodes 432 being insulated from each other. The organic light emitting display panel provided by the present embodiment is applicable to the mutual capacitance touch. The touch driving electrode 431 and touch sensing electrode 432 form a capacitor. Touch diving signals are sequentially inputted into the touch driving electrodes 431, and detection signals are outputted by the touch sensing electrodes 432.

When the organic light emitting display panel is touched, the coupling between the touch driving electrodes 431 and touch sensing electrodes 432 adjacent to a touch position is affected, thereby changing the capacitance between the touch driving electrode 431 and the touch sensing electrode 432. A method for detecting a position of the touch point is as follows: touch driving signals are sequentially inputted to the touch driving electrodes 431, the touch sensing electrodes 432 output touch detection signals simultaneously, thereby obtaining values of the capacitance of all intersections of the touch driving electrodes 431 and touch sensing electrodes 432 (namely, capacitance value of the entire two dimensional plane); and coordinates of the touch point can be calculated according to the capacitance variation data for the two dimensional plane. The wettability adjustment layer 42 includes a plurality of wettability adjustment pattern zones 421 and hollow zones 422 among the plurality of wettability adjustment pattern zones 421. The hollow zones 422 of the wettability adjustment layer 42 includes a plurality of first hollow zones 4221 and a plurality of second hollow zones 4222. The touch driving electrodes 431 are arranged in the first hollow zones 4221, and the touch sensing electrodes 432 are arranged in the second hollow zones 4222.

Figure 4C:
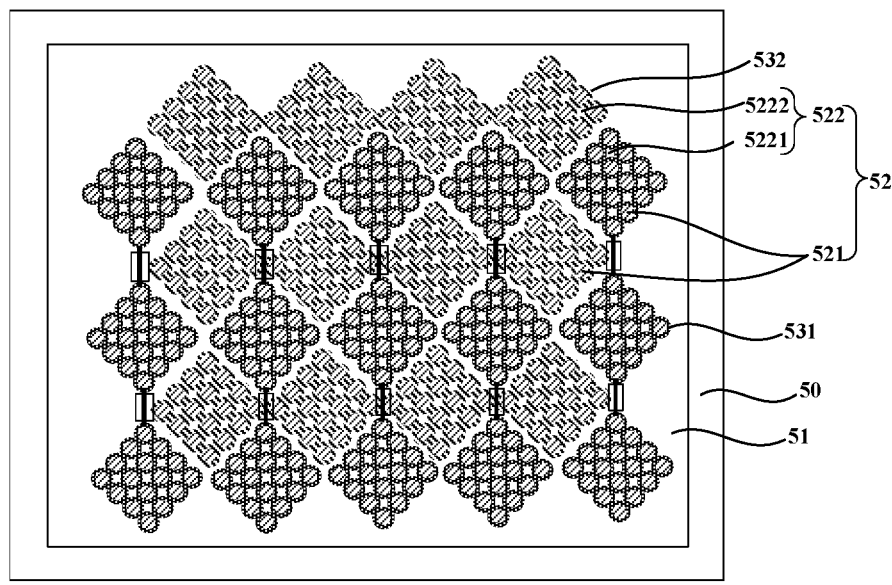
FIG. 4C is a schematic top view showing a structure of another organic light emitting display panel according to an embodiment of the present disclosure.

It should be noted that, the touch driving electrodes and touch sensing electrodes of the mutual capacitance touch structure which are disposed in a same layer may be provided in various other arrangement manners. As shown in FIG. 4C, the touch electrodes include a plurality of touch driving electrodes 531 and touch sensing electrodes 532. The touch driving electrode 531 are disposed in a same layer as the touch sensing electrodes 532 and insulated from the touch sensing electrodes 532. Since the touch driving electrodes 531 and the touch sensing electrodes 532 are provided in a same layer, each column of touch driving electrodes 531 are separated by the touch sensing electrodes 532, and the touch driving electrodes 531 at both sides of a separation position in the column are electrically connected to each other by means of a bridge structure. An insulation layer is arranged at a region where the bridge structure and the touch sensing electrode 532 are overlapped, so as to keep the touch driving electrode 531 and the touch sensing electrode 532 being insulated from each other. The wettability adjustment layer 52 includes a plurality of wettability adjustment pattern zones 521 and hollow zones 522 among the plurality of wettability adjustment pattern zones 521. The hollow zones 522 of the wettability adjustment layer 52 include a plurality of first hollow zones 5221 and a plurality of second hollow zones 5222. The touch driving electrodes 531 are arranged in the first hollow zones 5221, and the touch sensing electrodes 532 are arranged in the second hollow zones 5222. The organic light emitting display panel further includes an organic light emitting element array substrate 50 and a thin film encapsulation layer 51.

Figure 5A:
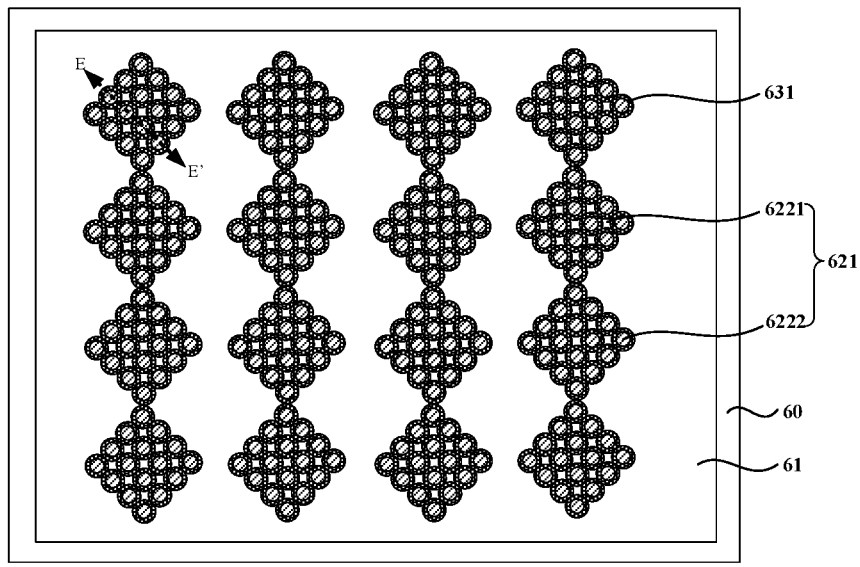
FIG. 5A is a schematic top view, as viewed from touch driving electrodes side, showing a structure of the organic light emitting display panel according to an embodiment of the present disclosure.
Figure 5B:
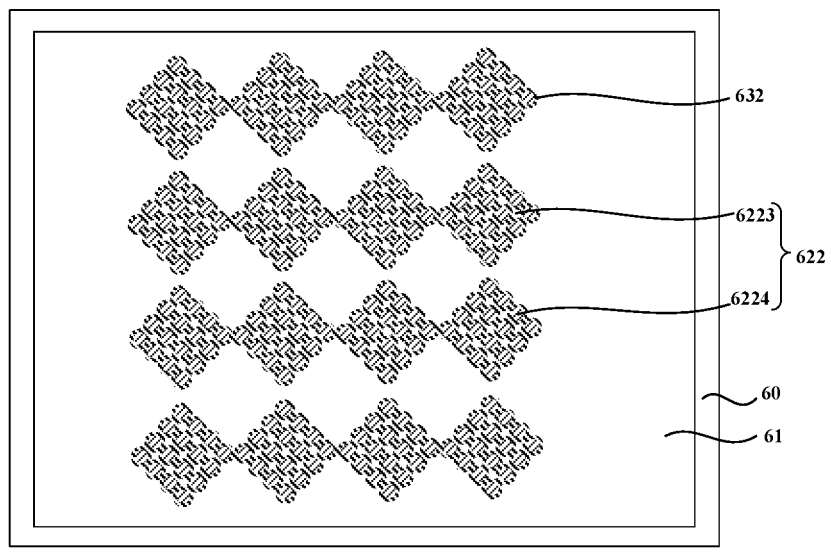
FIG. 5B is a schematic top view, as viewed from a touch sensing electrode side, showing a structure of the organic light emitting display panel according to an embodiment of the present disclosure.
Figure 5C:
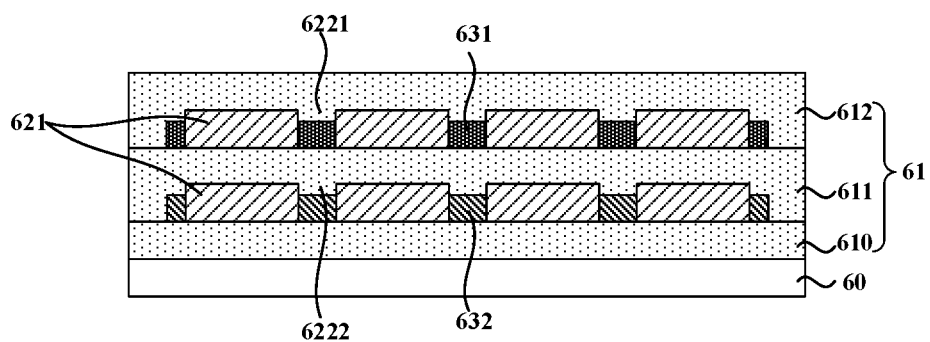
FIG. 5C is a schematic view showing a sectional structure along EE' in FIG. 5A.

FIG. 5A is a schematic top view, as viewed from the touch driving electrode side, showing the structure of an organic light emitting display panel according to an embodiment of the present disclosure. FIG. 5B is a schematic top view, as viewed from the touch sensing electrode side, showing the structure of the organic light emitting display panel according to the embodiment of the present disclosure. FIG. 5C is a schematic view showing the sectional structure along EE' in FIG. 5A. Referring to FIG. 5A, FIG. 5B and FIG. 5C, being different with FIGS. 4A to 4C, a plurality of touch driving electrodes 631 and a plurality of touch sensing electrodes 632 are disposed in different layers, the plurality of touch driving electrodes 631 intersect the plurality of touch sensing electrodes 632 and are insulated from the plurality of touch sensing electrodes 632. Exemplarily, the touch driving electrodes 631 and the touch sensing electrodes 632 in FIGS. 5A and 5B are separated by a first organic layer 611 in a thin film encapsulation layer 61, so as to ensure that the touch driving electrodes 631 are insulated from the touch sensing electrodes 632.

The organic light emitting display panel provided by the present embodiment is applicable to the mutual capacitance touch. The touch driving electrode 631 and the touch sensing electrode 632 form a capacitor. Touch driving signals are inputted to the touch driving electrodes 631 sequentially, and the touch sensing electrodes 632 output detection signals. When the display panel is touched, the position of the touch point may be obtained similarly via values of the capacitance at intersections of the touch driving electrodes 631 and the touch sensing electrodes 632. The wettability adjustment layer includes a touch driving electrode wettability adjustment layer 621 and a touch sensing electrode wettability adjustment layer 622. The touch driving electrode wettability adjustment layer 621 includes a plurality of first wettability adjustment pattern zones 6222 and first hollow zones 6221 among the plurality of first wettability adjustment pattern zones 6222. The touch driving electrodes 631 are arranged in the first hollow zones 6221. The touch sensing electrode wettability adjustment layer 622 includes a plurality of second wettability adjustment pattern zones 6224 and second hollow zones 6223 among the plurality of second wettability adjustment pattern zones 6224. The touch sensing electrodes 632 are arranged in the second hollow zones 6223. At least one organic layer and/or at least one inorganic layer are disposed between the touch driving electrode wettability adjustment layer 621 and the touch sensing electrode wettability adjustment layer 622.

It should be noted that, in the organic light emitting display panel shown in the above FIGS. 5A to 5C, only an arrangement is exemplarily illustrated, in which the touch driving electrodes are disposed between the first organic layer and the second inorganic layer, and the touch sensing electrodes are disposed between the first inorganic layer and the first organic layer. However, in other embodiments, the number of organic layers and inorganic layers, and the positions of the touch driving electrodes and the touch sensing electrodes may be set according to requirements of actual products, as long as the touch driving electrodes and the touch sensing electrodes are disposed in different layers and at least one organic layer and/or inorganic layer is provided.

Based on a same concept, an embodiment of the present disclosure provides a method for manufacturing an organic light emitting display panel. The method includes: forming an organic light emitting element array substrate; forming a thin film encapsulation layer covering the organic light emitting element array substrate, the thin film encapsulation layer includes at least one inorganic layer and at least one organic layer.

During the process of forming the thin film encapsulation layer covering the organic light emitting element array substrate, after forming an inorganic layer or organic layer of the thin film encapsulation layer, the method further includes: forming a wettability adjustment layer including a plurality of wettability adjustment pattern zones and hollow zones among the plurality of wettability adjustment pattern zones on the inorganic layer or organic layer of the thin film encapsulation layer; and then forming touch electrodes in the hollow zones. The touch electrodes are made of metal and in a meshed structure. A wetting angle between material of the touch electrodes and the wettability adjustment pattern zones is α, and a wetting angle between the material of the touch electrodes and an inorganic layer or an organic layer is β, the inorganic layer or the organic layer is located at a first side of the wettability adjustment layer, the first side of the wettability adjustment layer faced the organic light emitting element array substrate, where α is greater than β.

According to the present disclosure, the touch electrodes are integrated in the thin film encapsulation layer, so that the touch electrodes are prevented from being corroded by external moisture, oxygen and the like, and the thickness of the organic light emitting display panel would not be increased, consistent with the development trend of being thinner. In addition, the present disclosure can effectively avoid damages to material of each film in the thin film encapsulation layer and material of the light emitting element layer of the organic light emitting display panel duo to the manufacturing process of photoetching and etching the touch electrode in the existing technology, by utilizing a magnitude relationship between the wetting angle between the material of the touch electrodes and the wettability adjustment pattern zones and the wetting angle between the material of the touch electrodes and the inorganic layer or organic layer at a side, close to the light emitting element array substrate, of the wettability adjustment pattern zones and arranging the touch electrodes in the hollow zones among the plurality of wettability adjustment pattern zones by means of the wettability adjustment layer, thereby improving the operation reliability of the organic light emitting display panel.

Optionally, the wettability adjustment layer may be formed by an etching process. The step of forming a wettability adjustment layer including a plurality of wettability adjustment pattern zones and hollow zones among the plurality of wettability adjustment pattern zones on the inorganic layer or organic layer of the thin film encapsulation layer, includes:

forming a wettability adjustment material film on the inorganic layer or organic layer of the thin film encapsulation layer;

forming, through an etching process, the plurality of wettability adjustment pattern zones and the hollow zones among the plurality of wettability adjustment pattern zones in the wettability adjustment material film.

Optionally, the wettability adjustment layer which includes the plurality of wettability adjustment pattern zones and the hollow zones among the plurality of wettability adjustment pattern zones may be formed on the inorganic layer or organic layer of the thin film encapsulation layer by means of an ink-jet printing process, or a silkscreen printing process or a vapor deposition process.

Optionally, the touch electrodes may be formed by means of an ink-jet printing process or a coating process.

Optionally, the wettability adjustment layer and the touch electrodes and each film of the thin film encapsulation layer may be formed by means of an ink-jet printing process. In this way, after the organic light emitting element array substrate is formed, the subsequent thin film encapsulation layer, wettability adjustment layer and touch electrodes may be manufactured by means of one sort of process, thereby avoiding changing manufacturing chamber and a transport pollution of a sample, and simplifying the manufacturing process of the organic light emitting display panel.

Figure 6:
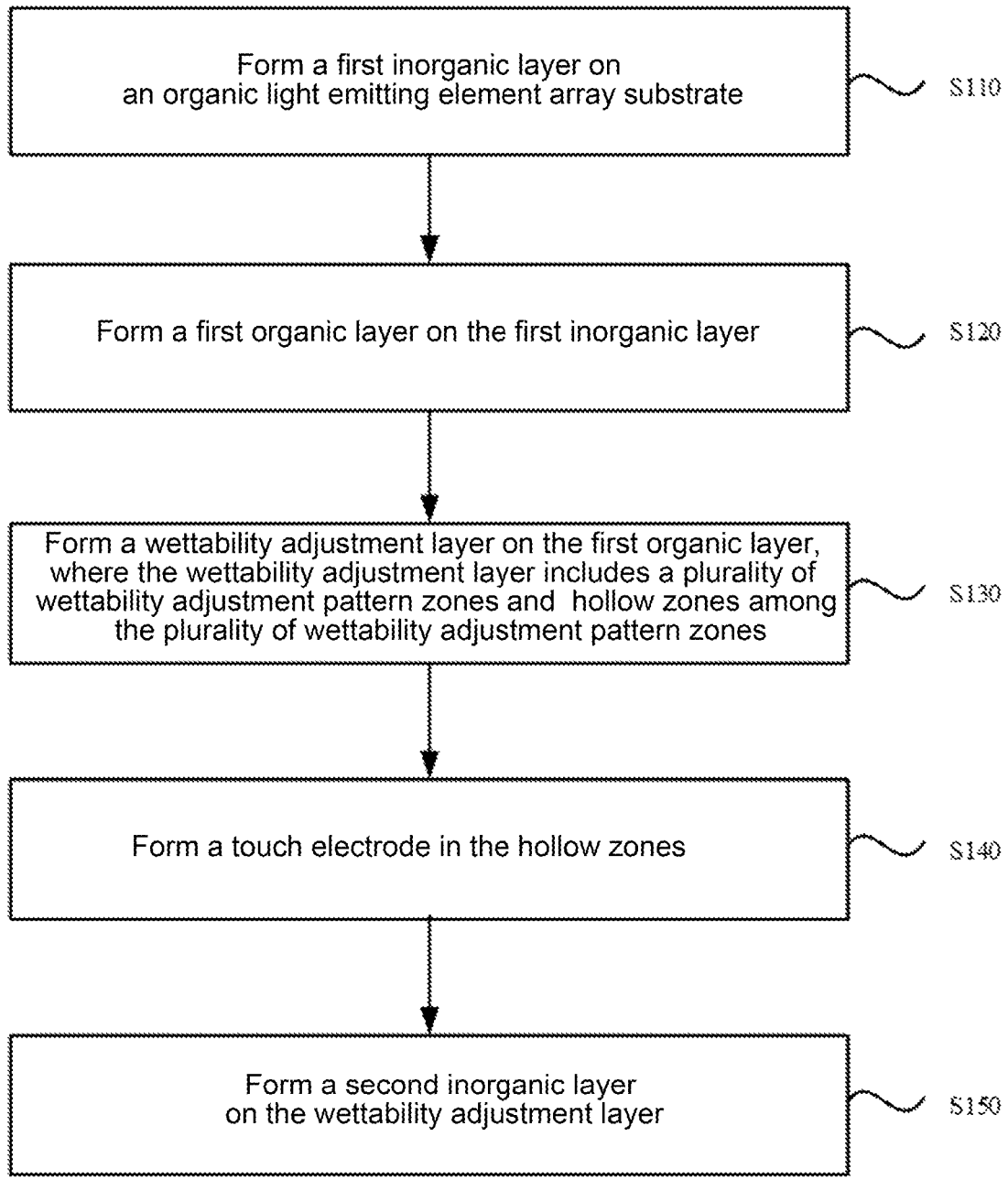
FIG. 6 is a schematic flowchart of a method for manufacturing an organic light emitting display panel according to an embodiment of the present disclosure.

FIG. 6 is a schematic flowchart of a method for manufacturing an organic light emitting display panel according to an embodiment of the present disclosure. As shown in FIG. 6, the method includes step S110 to step S150.

In step S110, a first inorganic layer is formed on an organic light emitting element array substrate.

In step S120, a first organic layer is formed on the first inorganic layer.

In step S130, a wettability adjustment layer is formed on the first organic layer. The wettability adjustment layer includes a plurality of wettability adjustment pattern zones and hollow zones among the plurality of wettability adjustment pattern zones.

In step S140, touch electrodes are formed in the hollow zones.

In step S150, a second inorganic layer is formed on the wettability adjustment layer.

The wetting angle between the first organic layer and the material of the touch electrodes is the minimum.

Figure 7:
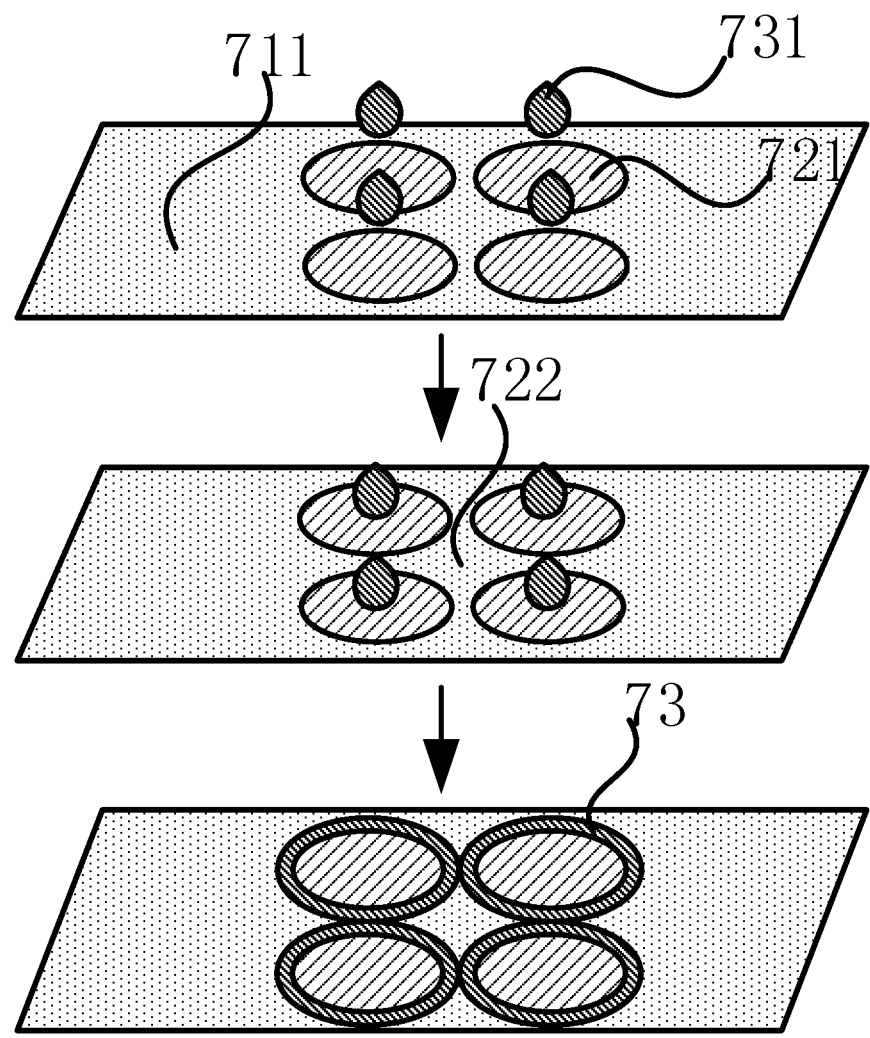
FIG. 7 is a schematic diagram showing a process of touch electrodes.

FIG. 7 is a schematic diagram showing a process of manufacturing touch electrodes. As shown in FIG. 7, a wettability adjustment layer is formed on the first organic layer 711. The wettability adjustment layer includes a plurality of wettability adjustment pattern zones 721 and hollow zones 722 among the plurality of wettability adjustment pattern zones 721. Exemplarily, the wettability adjustment pattern zones 721 may be formed by the ink-jet printing manner, and touch electrode material 731 (such as silver paste) is sprayed on the surface of the wettability adjustment pattern zones by means of the ink-jet printing process or the coating process. Since the wetting angle α between the touch electrode material 731 and the wettability adjustment pattern zones 721 is greater than the wetting angle β between the touch electrode material 731 and the first organic layer 711, the touch electrode material 731 spreads out along edges of wettability adjustment pattern zones 721 by means of own surface tension and forms the touch electrodes 73 in the hollow zones 722.

For example, the structure of the organic light emitting display panel shown in FIG. 1B can be formed by the manufacturing method shown in FIG. 6.

Figure 8:
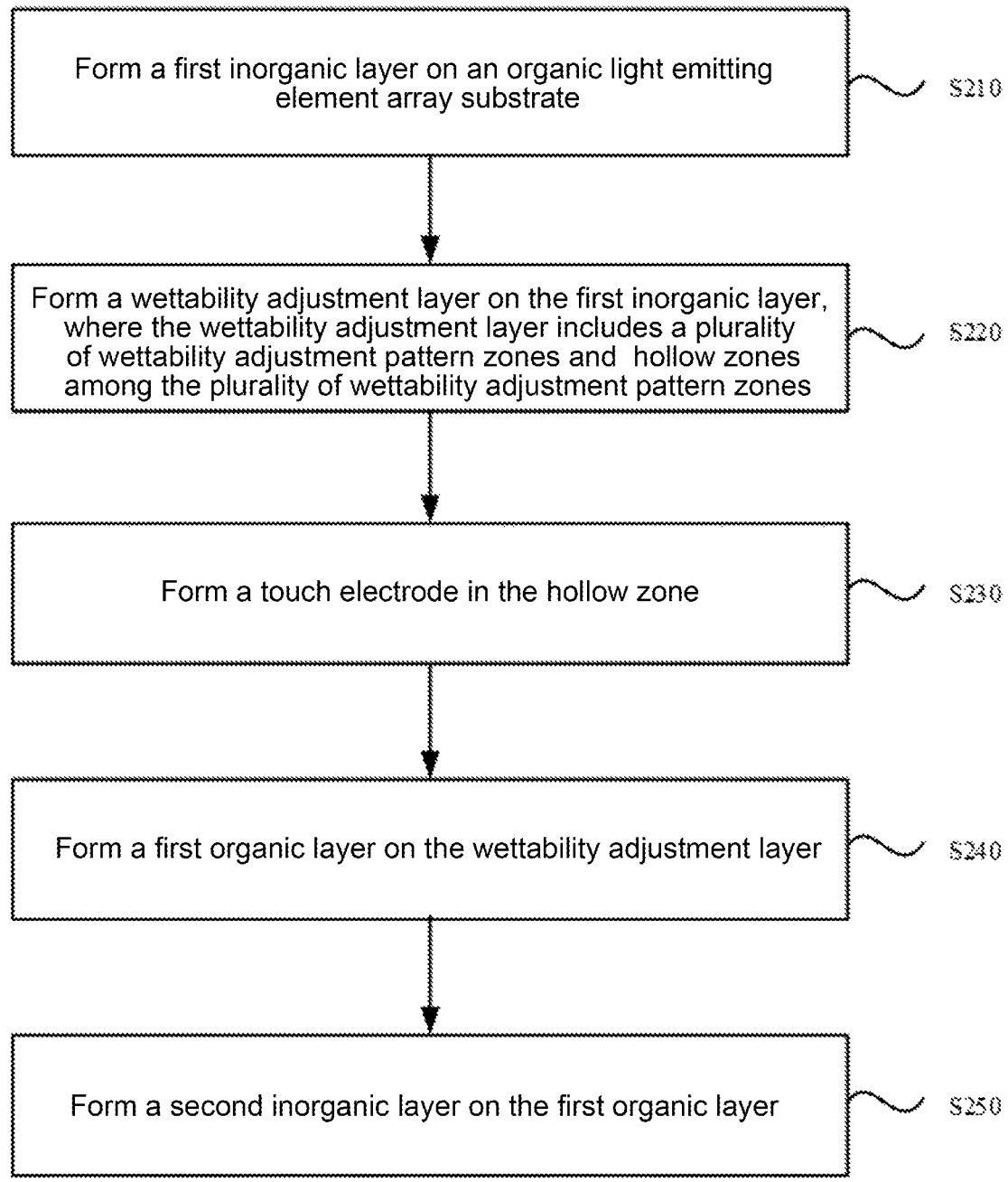
FIG. 8 is a schematic flowchart of another method for manufacturing the organic light emitting display panel according to an embodiment of the present disclosure.

FIG. 8 is a schematic flowchart of another method for manufacturing an organic light emitting display panel according to an embodiment of the present disclosure. As shown in FIG. 8, the method includes steps S210 to S250.

In step S210, a first inorganic layer is formed on an organic light emitting element array substrate.

In step S220, a wettability adjustment layer is formed on the first inorganic layer. The wettability adjustment layer includes a plurality of wettability adjustment pattern zones and hollow zones among the plurality of wettability adjustment pattern zones.

In step S230, touch electrodes are formed in the hollow zones.

In step S240, a first organic layer is formed on the wettability adjustment layer.

In step S250, a second inorganic layer is formed on the first organic layer.

The wetting angle between the first inorganic layer and the material of the touch electrodes is the minimum.

For example, the structure of the organic light emitting display panel shown in FIG. 2B can be formed by the manufacturing method shown in FIG. 8.

Figure 9:
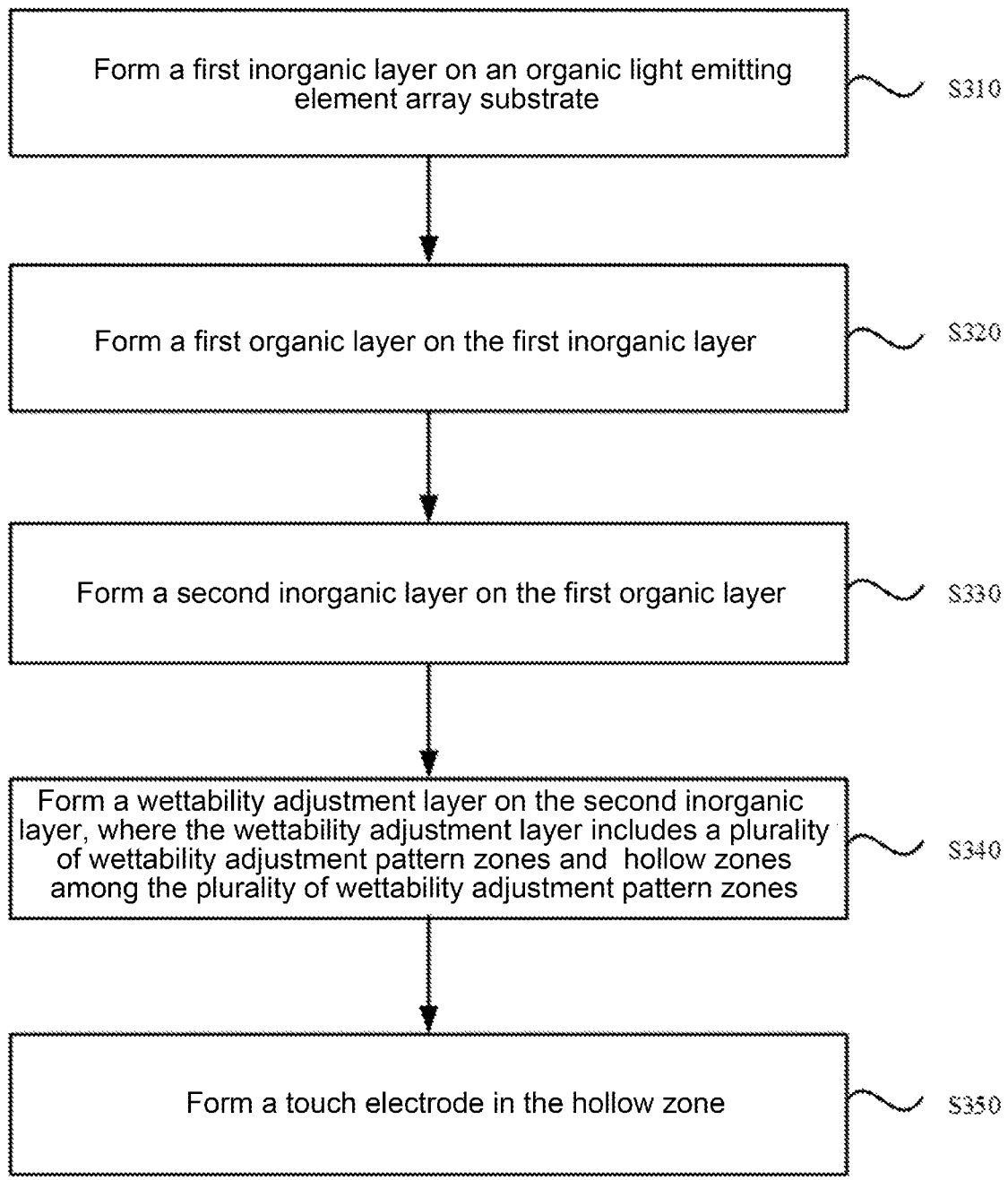
FIG. 9 is a schematic flowchart of another method for manufacturing the organic light emitting display panel according to an embodiment of the present disclosure.

FIG. 9 is a schematic flowchart of another method for manufacturing an organic light emitting display panel according to an embodiment of the present disclosure. As shown in FIG. 9, the method includes steps S310 to S350.

In step S310, a first inorganic layer is formed on an organic light emitting element array substrate.

In step S320, a first organic layer is formed on the first inorganic layer.

In step S330, a second inorganic layer is formed on the first organic layer.

In step S340, a wettability adjustment layer is formed on the second inorganic layer. The wettability adjustment layer includes a plurality of wettability adjustment pattern zones and hollow zones among the plurality of wettability adjustment pattern zones.

In step S350, touch electrodes are formed in the hollow zones.

The wetting angle between the second inorganic layer and the material of the touch electrodes is the minimum.

For example, the structure of the organic light emitting display panel shown in FIG. 3B can be formed by the manufacturing method shown in FIG. 9.

Figure 10:
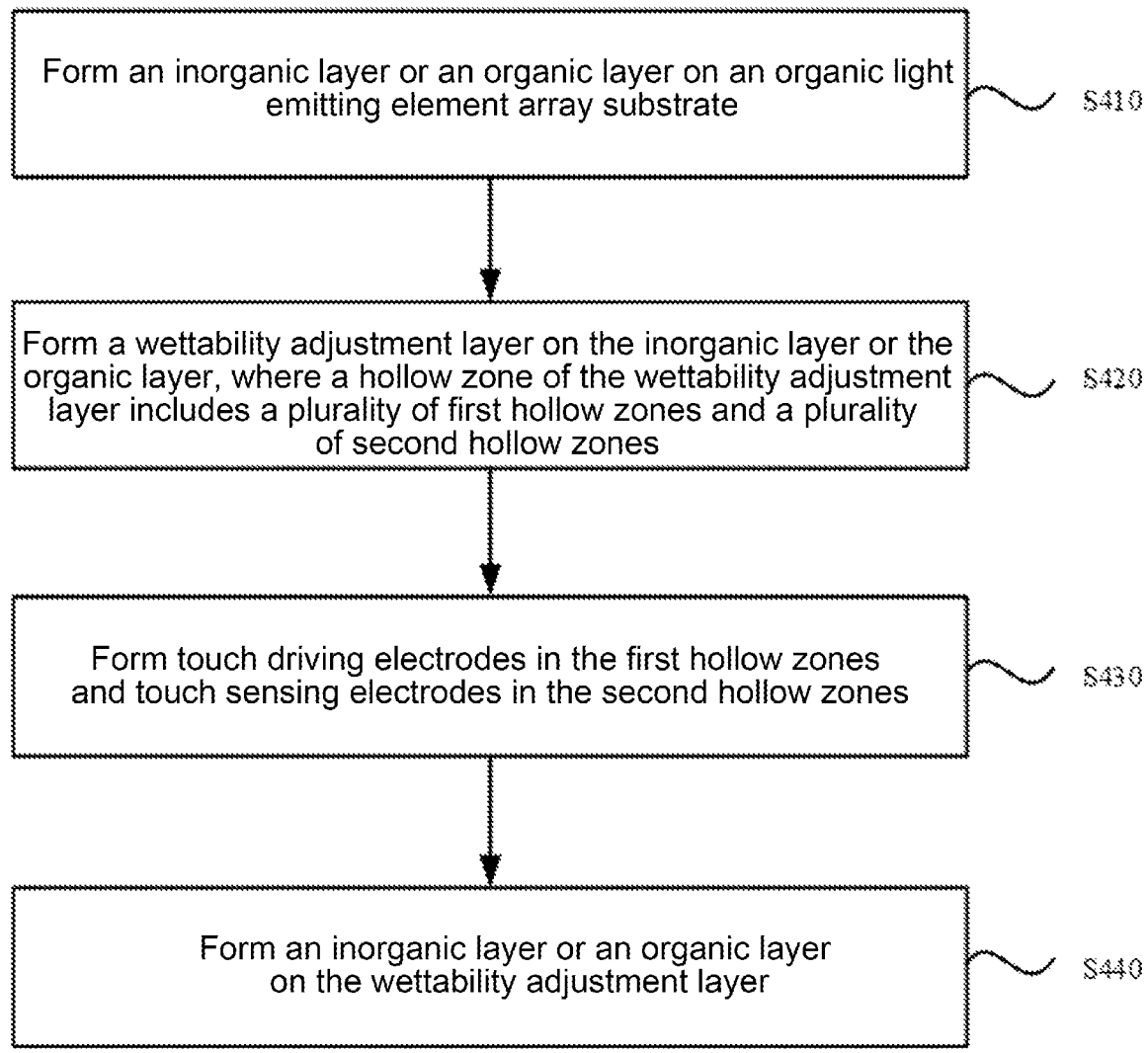
FIG. 10 is a schematic flowchart of another method for manufacturing the organic light emitting display panel according to an embodiment of the present disclosure.

FIG. 10 is a schematic flowchart of another method for manufacturing an organic light emitting display panel according to an embodiment of the present disclosure. As shown in FIG. 10, the method includes steps S410 to S440.

In step S410, an inorganic layer or an organic layer is formed on an organic light emitting element array substrate.

In step S420, a wettability adjustment layer is formed on the inorganic layer or the organic layer. Hollow zones of the wettability adjustment layer include a plurality of first hollow zones and a plurality of second hollow zones.

In step S430, touch driving electrodes are formed in the first hollow zones and touch sensing electrodes are formed in the second hollow zones.

In step S440, an inorganic layer or an organic layer is formed on the wettability adjustment layer.

Exemplarily, the method includes:

forming a first inorganic layer on an organic light emitting element array substrate;

forming a first organic layer on the first inorganic layer;

forming a wettability adjustment layer on the first organic layer, hollow zones of the wettability adjustment layer include a plurality of first hollow zones and a plurality of second hollow zones;

forming touch driving electrodes in the first hollow zones, and forming touch sensing electrodes in the second hollow zones;

forming a second inorganic layer on the wettability adjustment layer.

For example, the structure of the organic light emitting display panel shown in FIG. 4B can be formed by the manufacturing method shown in the above embodiment. Meanwhile, the touch driving electrodes may be disposed in a same layer as the touch sensing electrodes and insulated from the touch sensing electrodes by the bridge structure shown in FIGS. 4A and 4C.

It should be noted that the positions of the organic layer and inorganic layer in the stacked structure, the number of organic layers and inorganic layers are not limited by embodiments of the present disclosure, whether the organic layer or the inorganic layer contacts the organic light emitting element array substrate is not limited either.

Figure 11:
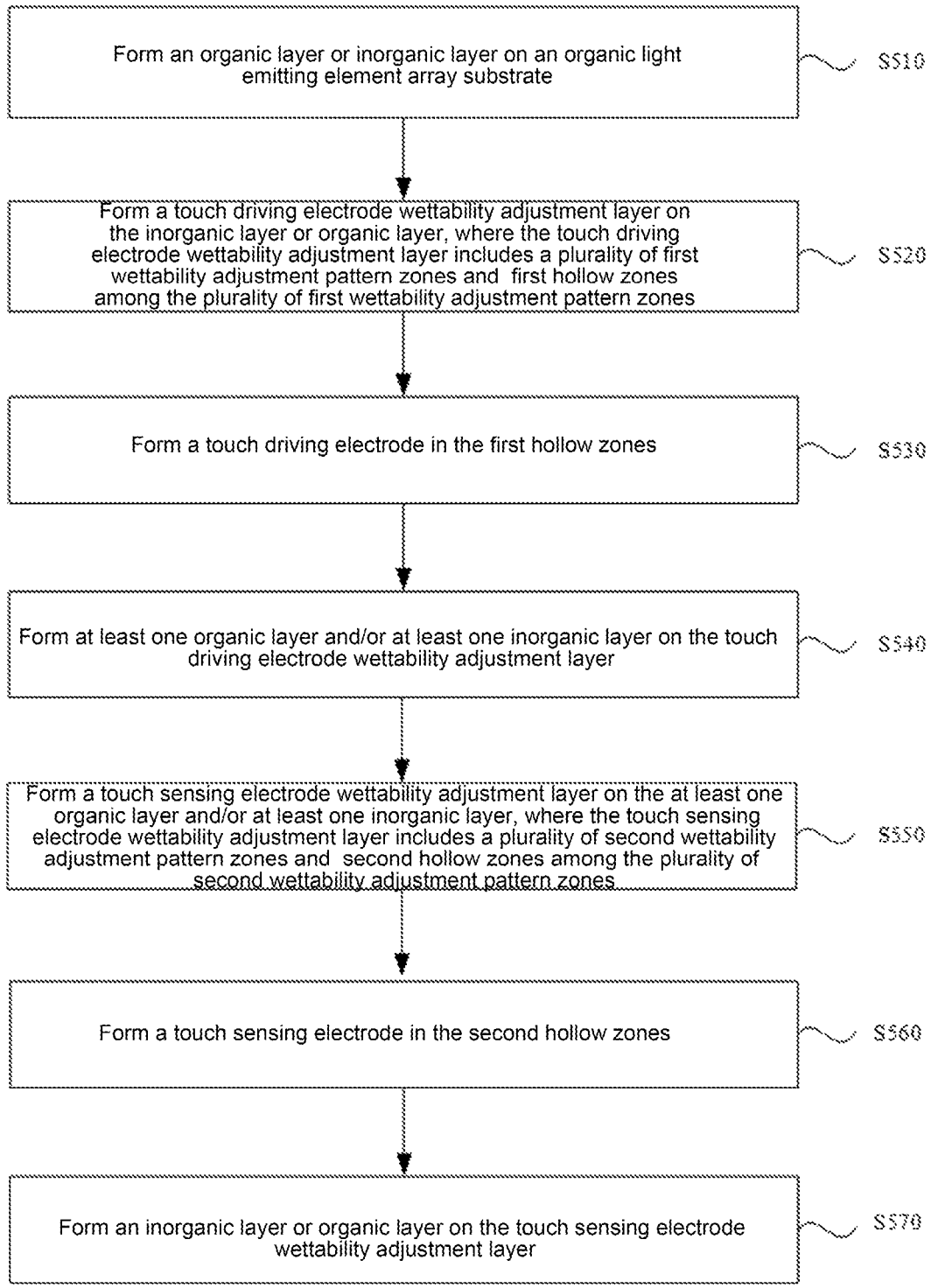
FIG. 11 is a schematic flowchart of another method for manufacturing the organic light emitting display panel according to an embodiment of the present disclosure.

FIG. 11 is a schematic flowchart of another method for manufacturing an organic light emitting display panel according to an embodiment of the present disclosure. As shown in FIG. 11, the method includes steps S510 to S570.

In step S510, an organic layer or inorganic layer is formed on an organic light emitting element array substrate.

In step S520, a touch driving electrode wettability adjustment layer is formed on the inorganic layer or organic layer. The touch driving electrode wettability adjustment layer includes a plurality of first wettability adjustment pattern zones and first hollow zones among the plurality of first wettability adjustment pattern zones.

In step S530, touch driving electrodes are formed in the first hollow zones.

In step S540, at least one organic layer and/or at least one inorganic layer is formed on the touch driving electrode wettability adjustment layer.

In step S550, a touch sensing electrode wettability adjustment layer is formed on the at least one organic layer and/or at least one inorganic layer. The touch sensing electrode wettability adjustment layer includes a plurality of second wettability adjustment pattern zones and second hollow zones among the plurality of second wettability adjustment pattern zones.

In step S560, touch sensing electrodes are formed in the second hollow zones.

In step S570, an inorganic layer or organic layer is formed on the touch sensing electrode wettability adjustment layer.

Exemplarily, the method includes:

forming a first inorganic layer on an organic light emitting element array substrate;

forming a touch sensing electrode wettability adjustment layer on the first inorganic layer, where the touch sensing electrode wettability adjustment layer includes a plurality of second wettability adjustment pattern zones and second hollow zones among the plurality of second wettability adjustment pattern zones;

forming touch sensing electrodes in the second hollow zones;

forming a first organic layer on the touch sensing electrode wettability adjustment layer;

forming a touch driving electrode wettability adjustment layer on the first organic layer, where the touch driving electrode wettability adjustment layer includes a plurality of first wettability adjustment pattern zones and a first hollow zone among the plurality of first wettability adjustment pattern zones;

forming touch driving electrodes in the first hollow zones.

forming a second inorganic layer on the touch driving electrode wettability adjustment layer.

For example, the structure of the organic light emitting display panel shown in FIG. 5C can be formed by the manufacturing method shown in the above embodiment. The touch driving electrodes and the touch sensing electrodes are disposed in different layers, meanwhile, an insulation-intersection structure shown in FIGS. 5A and 5B is formed by the touch driving electrodes and the touch sensing electrodes.

It should be noted that, the sequence of forming the touch driving electrodes and the touch sensing electrodes is not limited by embodiments of the present disclosure. Alternatively, the touch sensing electrodes are formed on the inorganic layer or organic layer firstly, and the touch driving electrodes are formed after forming the inorganic layer or organic layer on the touch sensing electrode wettability adjustment layer. The positions of the organic layer and inorganic layer in the stacked structure, the number of organic layers and the number of inorganic layers are not limited by embodiments of the present disclosure. It is not limited whether the organic layer or the inorganic layer contacts the organic light emitting element array substrate either.

Noted that, the above is only preferred embodiments of the present disclosure and the technical principle applied thereto. Those skilled in the art will appreciate that the present disclosure is not limited to the specific embodiments described herein. Those skilled in the art can make various other apparent changes, rearrangements and substitutions without departing from the scope of the disclosure. Thus, although the present disclosure has been described in detail with reference to the above embodiments, it is not limited to the above embodiments and may be embodied in other equivalent forms without departing from the scope of the present disclosure. The scope of the present disclosure is determined by the scope of the appended claims.

What is claimed is:

1. An organic light-emitting display panel, comprising an organic light-emitting element array substrate;
a thin film encapsulation layer covering the organic light-emitting element array substrate, wherein the thin film encapsulation layer comprises at least one inorganic layer and at least one organic layer;
a wettability adjustment layer disposed within the thin film encapsulation layer, wherein the wettability adjustment layer comprises a plurality of wettability adjustment pattern zones and hollow zones, wherein the hollow zones comprise first zones and second zones; and
touch electrodes within the thin film encapsulation layer, wherein the touch electrodes are made of metal, disposed in the first zones and spaced apart by the second zones, each of the touch electrodes corresponds to an array composed of multiple ones of the plurality of wettability adjustment pattern zones, wherein each of the touch electrodes comprises a plurality of ring-shaped electrodes arranged in an array, each of the plurality of ring-shaped electrodes surrounds a respective one of the plurality of wettability adjustment pattern zones,
wherein none of the plurality of wettability adjustment pattern zones is arranged between two adjacent touch electrodes,
wherein the plurality of wettability adjustment pattern zones and the touch electrodes are formed on one of the at least one organic layer and coated by one of the at least one inorganic layer, wherein the one of the at least one organic layer and the one of the at least one inorganic layer are in direct contact in the second zone between two adjacent touch electrodes.

2. The organic light emitting display panel according to claim 1, wherein each of the plurality of wettability adjustment pattern zones is a circular block, each of the plurality of ring-shaped electrodes is an annular electrode.

3. The organic light emitting display panel according to claim 2, wherein a diameter of each of the wettability adjustment pattern zones is in a range of 20 μm~300 μm.

4. The organic light emitting display panel according to claim 1, wherein a distance between adjacent wettability adjustment pattern zones is less than 10 μm.

5. The organic light emitting display panel according to claim 1, wherein a thickness of each of the wettability adjustment pattern zones is in a range of 0.1 μm~100 μm.

6. The organic light emitting display panel according to claim 1, wherein material of the wettability adjustment pattern zones is organic material.

7. The organic light emitting display panel according to claim 6, wherein the material of the wettability adjustment pattern zones comprises at least one of polytetrafluoroethylene, perfluoroalkoxy alkane, perfluoroethylene propylene copolymer, ethylene-tetrafluoroethylene copolymer, polyvinylidene fluoride, polychloro trifluoroethylene, ethylene-trifluoroethylene copolymer, polytetrachloroethylene-perfluoro-dioxolane copolymer and polyvinyl fluoride.

8. The organic light emitting display panel according to claim 1, wherein the touch electrodes comprise a plurality of touch driving electrodes and a plurality of touch sensing electrodes, the touch driving electrodes and the touch sensing electrodes are disposed in a same layer and the touch driving electrodes are insulated from the touch sensing electrodes, the first zones comprise a plurality of first hollow zones and a plurality of second hollow zones;
wherein the touch driving electrodes are provided in the first hollow zones and the touch sensing electrodes are provided in the second hollow zones.

9. The organic light emitting display panel according to claim 1, wherein the touch electrodes comprise a plurality of touch driving electrodes and a plurality of touch sensing electrodes, the touch driving electrodes intersect the touch sensing electrodes and are insulated from the touch sensing electrodes, and the touch driving electrodes and the touch sensing electrodes are disposed in different layers; wherein
the wettability adjustment layer comprises a touch driving electrode wettability adjustment layer and a touch sensing electrode wettability adjustment layer;
the touch driving electrode wettability adjustment layer comprises a plurality of first wettability adjustment pattern zones and first hollow zones interpersly arranged among the plurality of first wettability adjustment pattern zones; the touch driving electrodes are disposed in the first hollow zones;
the touch sensing electrode wettability adjustment layer comprises a plurality of second wettability adjustment pattern zones and second hollow zones among the plurality of second wettability adjustment pattern zones; the touch sensing electrodes are disposed in the second hollow zones; and
at least one organic layer and/or at least one inorganic layer is disposed between the touch driving electrode wettability adjustment layer and the touch sensing electrode wettability adjustment layer.

10. An organic light-emitting display panel, comprising:
an organic light-emitting element array substrate;
a thin film encapsulation layer covering the organic light-emitting element array substrate, wherein the thin film encapsulation layer comprises a first inorganic layer, a first organic layer and a second inorganic layer, and the first organic layer is disposed between the first inorganic layer and the second inorganic layer;
a wettability adjustment layer disposed between the first organic layer and the second inorganic layer, wherein the wettability adjustment layer comprises a plurality of wettability adjustment pattern zones spaced apart from each other by hollow zones, wherein the hollow zones comprise first zones and second zones; and
touch electrodes disposed within the first hollow zones and spaced apart by the second zones,
wherein the touch electrodes and the plurality of wettability adjustment pattern zones both formed on the first organic layer and coated by the second inorganic layer,
wherein each of the touch electrodes corresponds to an array composed of multiple ones of the plurality of wettability adjustment pattern zones, wherein each of the touch electrodes comprises a plurality of ring-shaped electrodes arranged in an array, each of the plurality of ring-shaped electrodes surrounds a respective one of the plurality of wettability adjustment pattern zones, wherein none of the plurality of wettability adjustment pattern zones is arranged between two adjacent touch electrodes, wherein the first organic layer and the second inorganic layer are in direct contact in the second zone between two adjacent touch electrodes.

11. The organic light-emitting display panel according to claim 1, wherein the touch electrodes are spaced apart each other by the one of the at least one inorganic layer.

12. The organic light-emitting display panel according to claim 10, wherein each of the plurality of wettability adjustment pattern zones is a circular block formed on the first organic layer, and each of the plurality of ring-shaped electrodes is an annular electrode.

13. The organic light-emitting display panel according to claim 10, wherein the touch electrodes are spaced apart each other by the second inorganic layer.

* * * * *